United States Patent
Yin et al.

(10) Patent No.: US 7,576,400 B1
(45) Date of Patent: Aug. 18, 2009

(54) CIRCUITRY AND GATE STACKS

(75) Inventors: Zhiping Yin, Boise, ID (US); Ravi Iyer, Boise, ID (US); Thomas R. Glass, Idaho City, ID (US); Richard Holscher, Boise, ID (US); Ardavan Nirooomand, Boise, ID (US); Linda K. Somerville, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/559,903

(22) Filed: Apr. 26, 2000

Related U.S. Application Data

(62) Division of application No. 09/146,842, filed on Sep. 3, 1998, now Pat. No. 6,281,100.

(51) Int. Cl.
*H01L 29/78* (2006.01)

(52) U.S. Cl. ............... 257/414; 257/E29.156; 438/585

(58) Field of Classification Search ......... 257/412–413, 257/437, 639, 640, 649, E29.161, E23.157, 257/E29.156, 414, 315, 316; 438/585–592
See application file for complete search history.

(56) References Cited

U.S. PATENT DOCUMENTS

| | | | |
|---|---|---|---|
| 4,158,717 A | 6/1979 | Nelson | 428/446 |
| 4,444,617 A | 4/1984 | Whitcomb | 438/721 |
| 4,474,975 A | 10/1984 | Clemons et al. | 556/410 |
| 4,523,214 A | 6/1985 | Hirose et al. | |
| 4,552,783 A * | 11/1985 | Stoll et al. | 438/677 |
| 4,562,091 A | 12/1985 | Sachdev et al. | 427/489 |
| 4,592,129 A | 6/1986 | Legge | |
| 4,600,671 A | 7/1986 | Saitoh et al. | 430/57.5 |

(Continued)

FOREIGN PATENT DOCUMENTS

EP 0 464 515 A3 1/1992

(Continued)

OTHER PUBLICATIONS

U.S. Appl. No. 09/146,843, filed Sep. 1998, Li et al.

(Continued)

*Primary Examiner*—Jerome Jackson, Jr.
*Assistant Examiner*—Paul A Budd
(74) *Attorney, Agent, or Firm*—Schwegman, Lundberg & Woessner, P.A.

(57) ABSTRACT

The present invention includes semiconductor circuitry. Such circuitry encompasses a metal silicide layer over a substrate and a layer comprising silicon, nitrogen and oxygen in physical contact with the metal silicide layer. The present invention also includes a gate stack which encompasses a polysilicon layer over a substrate, a metal silicide layer over the polysilicon layer, an antireflective material layer over the metal silicide layer, a silicon nitride layer over the antireflective material layer, and a layer of photoresist over the silicon nitride layer, for photolithographically patterning the layer of photoresist to form a patterned masking layer from the layer of photoresist and transferring a pattern from the patterned masking layer to the silicon nitride layer, antireflective material layer, metal silicide layer and polysilicon layer. The patterned silicon nitride layer, antireflective material layer, metal silicide layer and polysilicon layer encompass a gate stack.

13 Claims, 3 Drawing Sheets

U.S. PATENT DOCUMENTS

| | | | |
|---|---|---|---|
| 4,648,904 A | 3/1987 | Depasquale et al. | 106/2 |
| 4,695,859 A | 9/1987 | Guha et al. | 257/64 |
| 4,702,936 A | 10/1987 | Maeda et al. | 427/583 |
| 4,755,478 A | 7/1988 | Abernathey et al. | 438/296 |
| 4,764,247 A | 8/1988 | Leveriza et al. | 438/725 |
| 4,805,683 A | 2/1989 | Magdo et al. | 216/40 |
| 4,833,096 A | 5/1989 | Huang et al. | 438/201 |
| 4,863,755 A | 9/1989 | Hess et al. | 427/574 |
| 4,870,470 A | 9/1989 | Bass, Jr. et al. | 257/324 |
| 4,905,073 A * | 2/1990 | Chen et al. | 257/371 |
| 4,907,064 A * | 3/1990 | Yamazaki et al. | 257/649 |
| 4,910,160 A | 3/1990 | Jennings et al. | 438/17 |
| 4,940,509 A | 7/1990 | Tso et al. | 438/757 |
| 4,954,867 A | 9/1990 | Hosaka | 257/639 |
| 4,971,655 A | 11/1990 | Stefano et al. | |
| 4,992,306 A | 2/1991 | Hochberg et al. | 427/255.29 |
| 5,034,348 A | 7/1991 | Hartswick et al. | 438/453 |
| 5,036,383 A | 7/1991 | Mori | |
| 5,061,509 A | 10/1991 | Naito et al. | 427/497 |
| 5,140,390 A | 8/1992 | Li et al. | 257/350 |
| 5,219,613 A | 6/1993 | Fabry et al. | 438/758 |
| 5,234,869 A | 8/1993 | Mikata et al. | 438/793 |
| 5,244,537 A | 9/1993 | Ohnstein | 216/18 |
| 5,260,600 A | 11/1993 | Harada | 257/639 |
| 5,270,267 A | 12/1993 | Ouellet | 438/597 |
| 5,286,661 A | 2/1994 | de Fresart et al. | 438/343 |
| 5,302,366 A | 4/1994 | Schuette et al. | 423/344 |
| 5,312,768 A | 5/1994 | Gonzalez | 438/227 |
| 5,314,724 A | 5/1994 | Tsukune et al. | 427/489 |
| 5,340,621 A | 8/1994 | Matsumoto et al. | 427/571 |
| 5,356,515 A | 10/1994 | Tahara et al. | 438/715 |
| 5,376,591 A | 12/1994 | Maeda et al. | 438/761 |
| 5,405,489 A | 4/1995 | Kim et al. | 438/698 |
| 5,413,963 A | 5/1995 | Yen et al. | 438/623 |
| 5,429,987 A | 7/1995 | Allen | 438/654 |
| 5,439,838 A | 8/1995 | Yang | 438/258 |
| 5,441,797 A | 8/1995 | Hogan et al. | 428/209 |
| 5,461,003 A | 10/1995 | Havemann et al. | 438/666 |
| 5,470,772 A | 11/1995 | Woo | 438/588 |
| 5,472,827 A | 12/1995 | Ogawa et al. | 430/315 |
| 5,472,829 A | 12/1995 | Ogawa | 430/325 |
| 5,482,894 A * | 1/1996 | Havemann | 438/623 |
| 5,498,555 A | 3/1996 | Lin | |
| 5,536,857 A | 7/1996 | Narula et al. | 556/10 |
| 5,541,445 A | 7/1996 | Quellet | 438/761 |
| 5,543,654 A | 8/1996 | Dennen | 257/386 |
| 5,554,567 A | 9/1996 | Wang | 438/624 |
| 5,591,494 A | 1/1997 | Sato et al. | 427/579 |
| 5,591,566 A | 1/1997 | Ogawa | 430/325 |
| 5,593,741 A | 1/1997 | Ikeda | 427/579 |
| 5,600,165 A | 2/1997 | Tsukamoto et al. | |
| 5,605,601 A | 2/1997 | Kawasaki | |
| 5,639,687 A | 6/1997 | Roman et al. | |
| 5,639,689 A | 6/1997 | Woo | |
| 5,641,607 A | 6/1997 | Ogawa et al. | 430/272.1 |
| 5,648,202 A | 7/1997 | Ogawa et al. | 430/325 |
| 5,652,187 A | 7/1997 | Kim et al. | 438/760 |
| 5,653,619 A | 8/1997 | Cloud et al. | |
| 5,656,330 A | 8/1997 | Niiyama et al. | 427/255.395 |
| 5,656,337 A | 8/1997 | Park et al. | 427/539 |
| 5,661,093 A | 8/1997 | Ravi et al. | 438/763 |
| 5,667,015 A | 9/1997 | Harestad et al. | 166/383 |
| 5,670,297 A | 9/1997 | Ogawa et al. | 430/318 |
| 5,674,356 A | 10/1997 | Nagayama | 438/694 |
| 5,677,015 A | 10/1997 | Hasegawa | 427/576 |
| 5,677,111 A | 10/1997 | Ogawa | 430/313 |
| 5,691,212 A | 11/1997 | Tsai et al. | 438/297 |
| 5,698,352 A | 12/1997 | Ogawa et al. | 430/14 |
| 5,709,741 A | 1/1998 | Akamatsu et al. | 106/287.11 |
| 5,710,067 A | 1/1998 | Foote et al. | 438/636 |
| 5,711,987 A | 1/1998 | Bearinger et al. | |
| 5,731,242 A | 3/1998 | Parat et al. | 438/586 |
| 5,741,721 A | 4/1998 | Stevens | 438/396 |
| 5,744,399 A | 4/1998 | Rostoker et al. | 438/622 |
| 5,747,388 A | 5/1998 | Küsters et al. | |
| 5,750,442 A | 5/1998 | Juengling | 438/761 |
| 5,753,320 A | 5/1998 | Mikoshiba et al. | 427/572 |
| 5,759,755 A | 6/1998 | Park et al. | 430/512 |
| 5,780,891 A | 7/1998 | Kauffman et al. | |
| 5,783,493 A | 7/1998 | Yeh et al. | 438/718 |
| 5,786,039 A | 7/1998 | Brouquet | 427/578 |
| 5,792,689 A | 8/1998 | Yang et al. | 438/253 |
| 5,800,877 A | 9/1998 | Maeda et al. | 427/535 |
| 5,801,399 A * | 9/1998 | Hattori et al. | 257/69 |
| 5,807,660 A | 9/1998 | Lin et al. | 430/313 |
| 5,817,549 A | 10/1998 | Yamazaki et al. | 438/166 |
| 5,831,321 A | 11/1998 | Nagayama | 257/412 |
| 5,838,052 A | 11/1998 | McTeer | 257/437 |
| 5,840,610 A | 11/1998 | Gilmer et al. | |
| 5,858,880 A | 1/1999 | Dobson et al. | 438/758 |
| 5,872,035 A | 2/1999 | Kim et al. | 438/261 |
| 5,872,385 A | 2/1999 | Taft et al. | 257/437 |
| 5,874,367 A | 2/1999 | Dobson | 438/787 |
| 5,883,011 A | 3/1999 | Lin et al. | 438/747 |
| 5,883,014 A | 3/1999 | Chen et al. | 438/782 |
| 5,924,000 A | 7/1999 | Linliu | |
| 5,933,721 A | 8/1999 | Hause et al. | 438/217 |
| 5,948,482 A | 9/1999 | Brinker et al. | 516/33 |
| 5,956,605 A | 9/1999 | Akram et al. | |
| 5,960,289 A | 9/1999 | Tsui et al. | 438/275 |
| 5,962,581 A | 10/1999 | Hayase et al. | 524/588 |
| 5,968,324 A | 10/1999 | Cheung et al. | 204/192.28 |
| 5,968,611 A | 10/1999 | Kaloyeros et al. | 427/579 |
| 5,981,368 A | 11/1999 | Gardner et al. | 438/217 |
| 5,985,519 A | 11/1999 | Kakamu et al. | |
| 5,986,318 A | 11/1999 | Kim et al. | 257/437 |
| 5,994,217 A | 11/1999 | Ng | |
| 5,994,730 A * | 11/1999 | Shrivastava et al. | 257/306 |
| 6,001,741 A | 12/1999 | Alers | 438/706 |
| 6,001,747 A | 12/1999 | Annapragada | 438/790 |
| 6,004,850 A | 12/1999 | Lucas et al. | 438/301 |
| 6,008,121 A | 12/1999 | Yang et al. | 438/637 |
| 6,008,124 A | 12/1999 | Sekiguchi et al. | 438/653 |
| 6,017,779 A | 1/2000 | Miyasaka | 438/149 |
| 6,020,243 A | 2/2000 | Wallace et al. | 438/287 |
| 6,022,404 A | 2/2000 | Ettlinger et al. | 106/404 |
| 6,028,015 A | 2/2000 | Wang et al. | 438/789 |
| 6,030,901 A | 2/2000 | Hopper et al. | 438/711 |
| 6,040,619 A * | 3/2000 | Wang et al. | 257/649 |
| 6,054,379 A | 4/2000 | Yau et al. | 438/623 |
| 6,057,217 A | 5/2000 | Uwsawa | |
| 6,060,765 A * | 5/2000 | Maeda | 257/635 |
| 6,060,766 A * | 5/2000 | Mehta et al. | 257/639 |
| 6,071,799 A | 6/2000 | Park et al. | 438/595 |
| 6,072,227 A | 6/2000 | Yau et al. | 257/642 |
| 6,087,064 A | 7/2000 | Lin et al. | 430/270.1 |
| 6,087,267 A | 7/2000 | Dockrey et al. | 438/719 |
| 6,096,656 A | 8/2000 | Matzke et al. | 438/702 |
| 6,114,255 A | 9/2000 | Juengling | 438/763 |
| 6,121,133 A | 9/2000 | Iyer et al. | 438/636 |
| 6,124,641 A | 9/2000 | Matsuura | 257/759 |
| 6,130,168 A | 10/2000 | Chu et al. | 439/717 |
| 6,133,096 A | 10/2000 | Su et al. | 438/264 |
| 6,133,613 A * | 10/2000 | Yao et al. | 257/437 |
| 6,133,618 A | 10/2000 | Steiner | |
| 6,136,636 A | 10/2000 | Wu | 438/231 |
| 6,140,151 A | 10/2000 | Akram | 438/113 |
| 6,140,677 A | 10/2000 | Gardner et al. | 257/327 |
| 6,143,670 A | 11/2000 | Cheng et al. | 438/780 |
| 6,144,083 A | 11/2000 | Yin | |
| 6,153,504 A | 11/2000 | Shields et al. | |
| 6,156,674 A | 12/2000 | Li et al. | 438/780 |
| 6,159,804 A | 12/2000 | Gardner et al. | 438/265 |
| 6,159,871 A | 12/2000 | Loboda et al. | 438/786 |

| | | | |
|---|---|---|---|
| 6,184,151 B1 | 2/2001 | Adair et al. ............... 438/743 |
| 6,184,158 B1 | 2/2001 | Shufflebotham et al. .... 438/788 |
| 6,187,657 B1 | 2/2001 | Xiang et al. ............... 438/596 |
| 6,187,694 B1 | 2/2001 | Cheng et al. ............... 438/142 |
| 6,198,144 B1 | 3/2001 | Pan et al. .................. 257/412 |
| 6,200,835 B1 | 3/2001 | Manning .................... 438/158 |
| 6,204,168 B1 | 3/2001 | Naik et al. ................. 438/638 |
| 6,207,587 B1 | 3/2001 | Li et al. |
| 6,209,484 B1 | 4/2001 | Huang et al. ............. 118/723 E |
| 6,218,292 B1 | 4/2001 | Foote |
| 6,225,217 B1 | 5/2001 | Usami et al. ............... 438/637 |
| 6,225,671 B1 | 5/2001 | Yin |
| 6,235,568 B1 | 5/2001 | Murthy et al. ............. 438/231 |
| 6,235,591 B1 | 5/2001 | Balasubramanian et al. 438/275 |
| 6,238,976 B1 | 5/2001 | Noble et al. ............... 438/259 |
| 6,268,282 B1 | 7/2001 | Sandhu et al. ............. 438/636 |
| 6,284,677 B1 | 9/2001 | Hsiao et al. ............... 438/783 |
| 6,313,018 B1 * | 11/2001 | Wang et al. ............... 438/584 |
| 6,373,114 B1 | 4/2002 | Jeng et al. ................. 257/413 |
| 6,403,464 B1 | 6/2002 | Chang ....................... 438/623 |
| 6,429,115 B1 | 8/2002 | Tsai et al. ................. 438/622 |
| 6,435,943 B1 | 8/2002 | Chang et al. ................ 451/28 |
| 6,436,808 B1 | 8/2002 | Ngo et al. .................. 438/623 |
| 6,440,860 B1 | 8/2002 | DeBoer et al. ............. 438/703 |
| 6,444,593 B1 | 9/2002 | Ngo et al. .................. 438/788 |
| 6,465,372 B1 | 10/2002 | Xia et al. .................. 438/787 |
| 6,486,057 B1 | 11/2002 | Yeh et al. .................. 438/633 |
| 6,486,061 B1 | 11/2002 | Xia et al. .................. 438/680 |
| 6,492,688 B1 | 12/2002 | Ilg ............................ 257/369 |
| 6,498,084 B2 | 12/2002 | Bergemont |
| 6,503,818 B1 | 1/2003 | Jang .......................... 438/584 |
| 6,518,122 B1 | 2/2003 | Chan et al. ................. 438/257 |
| 6,541,164 B1 * | 4/2003 | Kumar et al. ................. 430/5 |
| 6,627,535 B2 | 9/2003 | MacNeil et al. ............ 438/634 |
| 6,638,875 B2 | 10/2003 | Han et al. .................. 438/725 |
| 6,720,247 B2 | 4/2004 | Kirkpatrick et al. ......... 438/622 |
| 6,723,631 B2 | 4/2004 | Noguchi et al. ............. 438/618 |
| 2001/0003064 A1 | 6/2001 | Ohto |
| 2001/0019868 A1 | 9/2001 | Gonzalez et al. ............ 438/275 |
| 2001/0023051 A1 | 9/2001 | Rolfson et al. |
| 2001/0038919 A1 | 11/2001 | Berry, III et al. ............ 428/446 |
| 2002/0033486 A1 | 3/2002 | Kim et al. .................. 257/118 |
| 2002/0081834 A1 | 6/2002 | Daniels et al. ............. 438/624 |
| 2003/0013311 A1 | 1/2003 | Chang et al. |
| 2003/0077916 A1 | 4/2003 | Xu et al. .................... 438/778 |
| 2003/0207594 A1 | 11/2003 | Catabay et al. ............. 438/778 |
| 2004/0071878 A1 | 4/2004 | Schuhmacher et al. |

FOREIGN PATENT DOCUMENTS

| | | |
|---|---|---|
| EP | 0 471 185 A2 | 2/1992 |
| EP | 0 588 087 A2 | 3/1994 |
| EP | 0 588 087 A3 | 3/1994 |
| EP | 0 771 886 A1 | 5/1997 |
| EP | 0-778496 A2 | 6/1997 |
| EP | 0-778496 A3 | 6/1997 |
| EP | 0 942 330 A1 | 9/1999 |
| EP | 1172845 A2 | 1/2002 |
| JP | 593727 | 10/1947 |
| JP | 63-157443 | 6/1988 |
| JP | 63316476 | 12/1988 |
| JP | 06067019 A | 1/1992 |
| JP | 5-263255 | 10/1993 |
| JP | 6232113 | 8/1994 |
| JP | 6-244172 | 9/1994 |
| JP | 7201716 | 8/1995 |
| JP | 07201716 A | 8/1995 |
| JP | 08-045926 A | 2/1996 |
| JP | 8046186 | 2/1996 |
| JP | 08046186 A | 2/1996 |
| JP | 8046188 | 2/1996 |
| JP | 8051058 | 2/1996 |
| JP | 8078322 | 3/1996 |
| JP | 08-213386 A | 8/1996 |
| JP | 09-050993 | 2/1997 |
| JP | 9-55351 | 2/1997 |
| JP | 10-163083 | 6/1998 |
| JP | 200068261 A | 3/2000 |
| TW | 368687 A | 9/1999 |
| TW | 420844 A | 2/2001 |
| TW | 429473 A | 4/2001 |
| WO | 99/20029 | 8/1999 |
| WO | 99/20030 | 8/1999 |

OTHER PUBLICATIONS

U.S. Appl. No. 09/234,233, filed Sep. 1998, Li et al.
S. Wolf and R.N. Tauber. Silicon Processing for the VLSI Era (vol. 1-Process Technology). Prologue. pp. xxiii.
S. Wolf and R.N. Tauber, Silicon Processing for the VLSI Era (vol. 1-Process Technology). pp. 189-190. 1986.
Stanley Wolf, Silicon Processing for the VLSI Era. vol. 3, Lattice Press 1995, p. 635.
Wolf et al., Silicon Processing for the VLSI Era, 1986, Lattice Press, vol. 1, pp. 1 and 2.
Article: Bencher, C. et al., "Dielectric antirefelective coatings for DUV lithography", *Solid State Technology* (Mar. 1997), pp. 109-114.
Article: Dammel, R. R. et al., "Dependence of Optical Constants of AZ® BARLI™ Bottom Coating on Back Conditions", SPIE vol. 3049 (1997), pp. 963-973.
Text: Heavens, O. S., "*Optical Properties of Thin Solid Films*", pp. 48-49.
Text: Jenkins, F. et al., "Fundamentals of Optics", *Properties of Light*, pp. 9-10.
Text: Wolf, S. et al., "*Silicon Processing for the VLSI Era*", vol. 1, pp. 437-441.
McKenzie, D. et al., "New Technology for PACVD", Surface and Coatings Technology 82 (1996), pp. 326-333.
Shibata, Noboru, "Plasma-Chemical Vapor-Deposited Silicon Oxide/Silicon Oxynitrite Double-Layer Antireflective Coating for Solar Cells", Jap. Journ. of Applied Physics, vol. 30, No. 5, May 1991, pp. 997-1001.
U.S. Appl. No. 09/030,618, filed and amended Feb. 25, 1998, Hotscher.
Wolf, S., "Silicon Processing for the VLSI Era," vol. 1, pp. 407-413.
Wolf, S. "Silicon Processing for the VLSI Era", vol. 2, pp. 48-49 and 435.
Article: Bencher, C. et al., "Dielectric antireflective coatings for DUV lithography", *Solid State Technology* (Mar. 1997), pp. 109-114.
Article: Dammel, R. R. et al., "Dependence of Optical Constants of AZ® BARLI™ Bottom Coating on Back Conditions", SPIE vol. 3049 (1997), pp. 963-973.
Text: Heavens, O. S., "*Optical Properties of Thin Solid Films*", pp. 48-49, Dover Publications 1991.
Text: Jenkins, F. et al., "Fundamentals of Optics", *Properties of Light*, pp. 9-10, McGraw Hill 1976.
Text: Wolf, S. et al., "*Silicon Processing for the VLSI Era*", vol. 1, pp. 437-441, Lattice Press 1986.
Robert Withnall et al.; "Matrix Reactions of Methylsilanes and Oxygen Atoms"; 1988 American Chemical Society; pp. 594-602.
Weidman, T. et al., "New Photodefinable Glass Etch Masks for Entirely Dry Photolithography: Plasma Deposited Organosilicon Hydride Polymers", Appl. Phys. Lett., vol. 62, No. 4, Jan. 25, 1993, pp. 372-374.
Weidman, T. et al., "All Dry Lithography: Applications of Plasma Polymerized Methylsilane as a Single Layer Resist and Silicon Dioxide Precursor", J. Photopolym. Sci. Technol., vol. 8, No. 4, 1995, pp. 679-686.
Joubert, O. et al., "Application of Plasma Polymerized Methylsilane in an All Dry Resist Process for 193 and 248nm Lithography", Microelectronic Engineering 30 (1996), pp. 275-278.
Ajey M. Joshi et al; "Plasma Deposited Organosilicon Hydride Network Polymers as Versatile Resists for Entirely Dry Mid-Deep UV Photolithography"; SPIE vol. 1925/709; pp. 709-720, Jan. 26, 1993.

M. Matsuura et al.; "A Highly Reliable Self-planarizing Low-k Intermetal Dielectric for Sub-quarter Micron Interconnects"; IEEE Jul. 1997 pp. 31.6.1-31.6.4, Jul. 1997.

O. Horie et al.; "Kinetics and Mechanisms of the Reactions of O($^3$P) with $SiH_4$, $CH_3SiH_3$, $(CH_3)_2SiH_2$, and $(CH_3)_3SiH$"; 1991 American Chemical Society; pp. 4393-4400.

McClatchie, S. et al., "Low Dielectric Constant Flowfill Technology for IMD Applications", Proceed. of 3d Internatl. Dielectrics for ULSI Multilevel Interconnection Conf, Santa Clara, CA, Feb. 1997, pp. 34-40.

Beekman, K. et al., "Sub-Micron Gap Fill and In-Situ Planarisation Using Flowfill™ Technology", ULSI Conf, Portland, OR, Oct. 1995, pp. 1-7.

Kiermasz, A. et al., "Planarisation for Sub-Micron Devices Utilising a New Chemistry", DUMIC Conf., California, Feb. 1995, pp. 1-.

IBM Technical Disclosure Bulletin "Low-Temperature Deposition of SiO2, Si3N4 or SiO2-Si3N4," vol. 28, No. 9, p. 4170, Feb. 1986.

Text: Ralls, K. et al., "Introduction to Materials Science and Engineering", 1976 John Wiley & Sons, Inc., pp. 312-313.

Abstract: Loboda, M. et al., "Using Trimethylsilane to Improve Safety, Throughput and Versatility in PECVD Processes", Electrochemical Society Meeting Abstract No. 358, 191$^{st}$ Meeting, Montreal, Quebec, vol. MA 97-1, 1997, p. 454.

Laxman, R. et al., "Synthesizing Low-K CVD Materials for Fab Use", Semiconductor Internatl., Nov. 2000, pp. 95-102 (printed from www.semiconductor-intl.com).

Anonymous, "New Gas Helps Make Faster ICs", Machine Design, vol. 71, Iss. 21, Nov. 4, 1999, p. 118.

Julius Grant, "Hack's Chemical Dictionary", McGraw-Hill Book Company 1969, Fourth Edition, p. 27.

Wolf, S., "Silicon Processing for the VLSI Era," vol. 1, pp. 407-413, 1986 Lattice Press.

Wolf, S. "Silicon Processing for the VLSi Era", vol. 2, pp. 48-49 and 435, 1986 Lattice Press.

* cited by examiner

CIRCUITRY AND GATE STACKS

RELATED PATENT DATA

This patent resulted from a divisional application of U.S. patent application Ser. No. 09/146,842, filed Sep. 3, 1998 now U.S. Pat. No. 6,281,100.

TECHNICAL FIELD

The invention pertains to methods of forming and utilizing antireflective materials. The invention also pertains to semiconductor processing methods of forming stacks of materials, such as, for example, gate stacks.

BACKGROUND OF THE INVENTION

Semiconductor processing methods frequently involve patterning layers of materials to form a transistor gate structure. FIG. 1 illustrates a semiconductive wafer fragment 10 at a preliminary step of a prior art gate structure patterning process. Semiconductive wafer fragment 10 comprises a substrate 12 having a stack 14 of materials formed thereover. Substrate 12 can comprise, for example, monocrystalline silicon lightly doped with a p-type background dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Stack 14 comprises a gate oxide layer 16, a polysilicon layer 18, a metal silicide layer 20, an oxide layer 22, a nitride layer 24, an antireflective material layer 26, and a photoresist layer 28. Gate oxide layer 16 can comprise, for example, silicon dioxide, and forms an insulating layer between polysilicon layer 18 and substrate 12. Polysilicon layer 18 can comprise, for example, conductively doped polysilicon, and will ultimately be patterned into a first conductive portion of a transistor gate.

Silicide layer 20 comprises a metal silicide, such as, for example, tungsten silicide or titanium silicide, and will ultimately comprise a second conductive portion of a transistor gate. Prior to utilization of silicide layer 20 as a conductive portion of a transistor gate, the silicide is typically subjected to an anneal to improve crystallinity and conductivity of the silicide material of layer 20. Such anneal can comprise, for example, a temperature of from about 800° C. to about 900° C. for a time of about thirty minutes with a nitrogen ($N_2$) purge.

If silicide layer 20 is exposed to gaseous forms of oxygen during the anneal, the silicide layer can become oxidized, which can adversely effect conductivity of the layer. Accordingly, oxide layer 22 is preferably provided over silicide layer 20 prior to the anneal. Oxide layer 22 can comprise, for example, silicon dioxide. Another purpose of having oxide layer 22 over silicide layer 20 is as an insulative layer to prevent electrical contact of silicide layer 20 with other conductive layers ultimately formed proximate silicide layer 20.

Nitride layer 24 can comprise, for example, silicon nitride, and is provided to further electrically insulate conductive layers 18 and 20 from other conductive layers which may ultimately be formed proximate layers 18 and 20. Nitride layer 24 is a thick layer (a typical thickness can be on the order of several hundred, or a few thousand Angstroms) and can create stress on underlying layers. Accordingly, another function of oxide layer 22 is to alleviate stress induced by nitride layer 24 on underlying layers 18 and 20.

Antireflective material layer 26 can comprise, for example, an organic layer that is spun over nitride layer 24. Alternatively, layer 26 can be a deposited inorganic antireflective material, such as, for example, $Si_xO_yN_z$:H, wherein x is from 0.39 to 0.65, y is from 0.02 to 0.56, and z is from 0.05 to 0.33. In practice the layer can be substantially inorganic, with the term "substantially inorganic" indicating that the layer can contain a small amount of carbon (less than 1% by weight). Alternatively, if, for example, organic precursors are utilized, the layer can have greater than or equal to 1% carbon, by weight.

Photoresist layer 28 can comprise either a positive or a negative photoresist. Photoresist layer 28 is patterned by exposing the layer to light through a masked light source. The mask contains clear and opaque features defining a pattern to be created in photoresist layer 28. Regions of photoresist layer 28 which are exposed to light are made either soluble or insoluble in a solvent. If the exposed regions are soluble, a positive image of the mask is produced in photoresist layer 28 and the resist is termed a positive photoresist. On the other hand, if the non-radiated regions are dissolved by the solvent, a negative image results, and the photoresist is referred to as a negative photoresist.

A difficulty that can occur when exposing photoresist layer 28 to radiation is that waves of the radiation can propagate through photoresist 28 to a layer beneath the photoresist and then be reflected back up through the photoresist to interact with other waves of the radiation which are propagating through the photoresist. The reflected waves can constructively and/or destructively interfere with the other waves to create periodic variations of light intensity within the photoresist. Such variations of light intensity can cause the photoresist to receive non-uniform doses of energy throughout its thickness. The non-uniform doses can decrease the accuracy and precision with which a masked pattern is transferred to the photoresist. Antireflective material 26 is provided to suppress waves from reflecting back into photoresist layer 28. Antireflective layer 26 comprises materials which absorb and/or attenuate radiation and which therefore reduce or eliminate reflection of the radiation.

FIG. 2 shows semiconductive wafer fragment 10 after photoresist layer 28 is patterned by exposure to light and solvent to remove portions of layer 28.

Referring to FIG. 3, a pattern from layer 28 is transferred to underlying layers 16, 18, 20, 22, 24, and 26 to form a patterned stack 30. Such transfer of a pattern from masking layer 28 can occur by a suitable etch, such as, for example, a plasma etch utilizing one or more of Cl, HBr, $CF_4$, $CH_2F_2$, He, and $NF_3$.

After the patterning of layers 16, 18, 20, 22, 24 and 26, layers 28 and 26 can be removed to leave a patterned gate stack comprising layers 16, 18, 20, 22, and 24.

A continuing goal in semiconductor wafer fabrication technologies is to reduce process complexity. Such reduction can comprise, for example, reducing a number of process steps, or reducing a number of layers utilized in forming a particular semiconductor structure. Accordingly, it would be desirable to develop alternative methods of forming patterned gate stacks wherein fewer steps and/or layers are utilized than those utilized in the prior art embodiment described with reference to FIGS. 1-3.

SUMMARY OF THE INVENTION

In one aspect, the invention encompasses a semiconductor processing method. A metal silicide layer is formed over a substrate. An antireflective material layer is chemical vapor deposited in physical contact with the metal silicide layer. A layer of photoresist is applied over the antireflective material layer and patterned photolithographically.

In another aspect, the invention encompasses a gate stack forming method. A polysilicon layer is formed over a substrate. A metal silicide layer is formed over the polysilicon layer. An antireflective material layer is deposited over the metal silicide layer. A silicon nitride layer is formed over the antireflective material layer and a layer of photoresist is formed over the silicon nitride layer. The layer of photoresist is photolithographically patterned to form a masking layer from the layer of photoresist. A pattern is transferred from the is masking layer to the silicon nitride layer, antireflective material layer, metal silicide layer and polysilicon layer to pattern the silicon nitride layer, antireflective material layer, metal silicide layer and polysilicon layer into a gate stack.

In yet another aspect, the invention encompasses a gate stack comprising a polysilicon layer over a semiconductive substrate. The gate stack further comprises a metal silicide layer over the polysilicon layer, and a layer comprising silicon, oxygen and nitrogen over the metal silicide. Additionally, the gate stack comprises a silicon nitride layer over the layer comprising silicon, oxygen and nitrogen.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
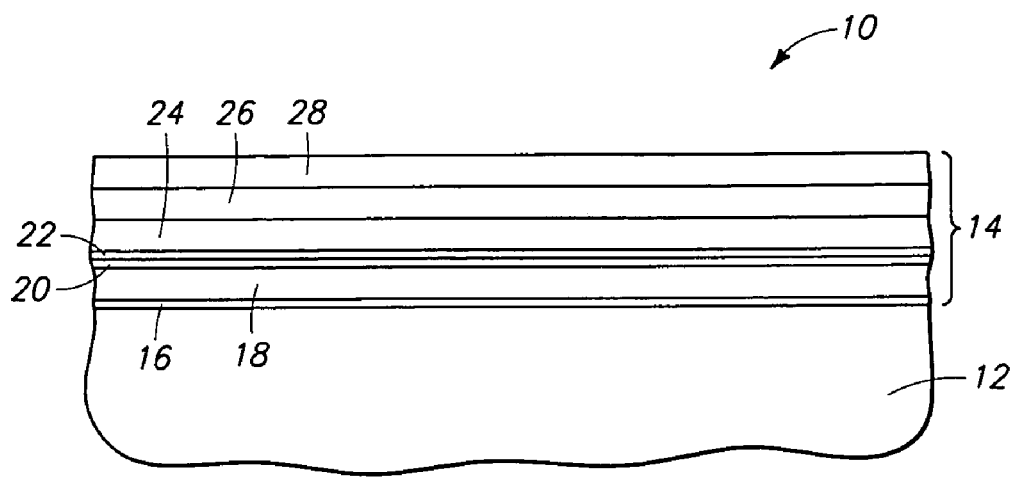
FIG. 1 is a fragmentary, diagrammatic, cross-sectional view of a semiconductive wafer fragment at a preliminary processing step of a prior art process.
Figure 2:
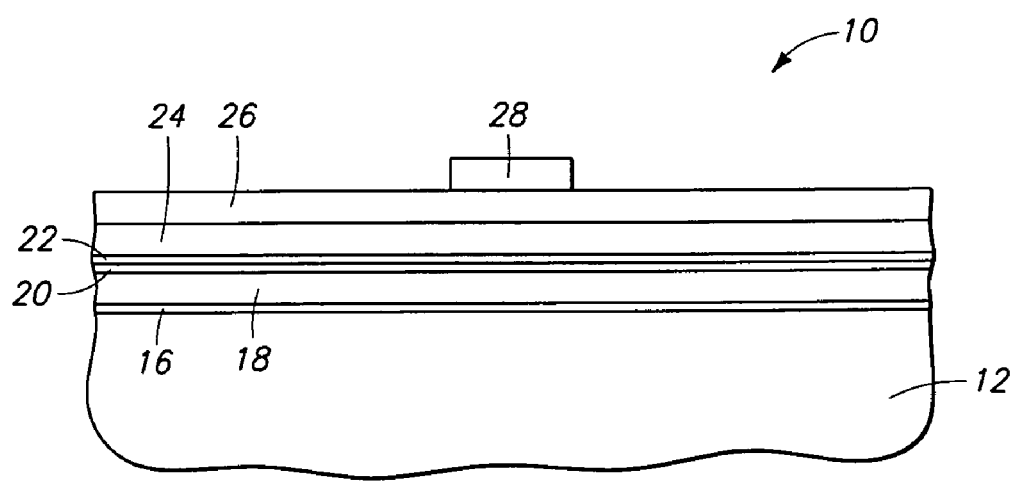
FIG. 2 is a view of the FIG. 1 wafer fragment at a prior art processing step subsequent to that of FIG. 1.
Figure 3:
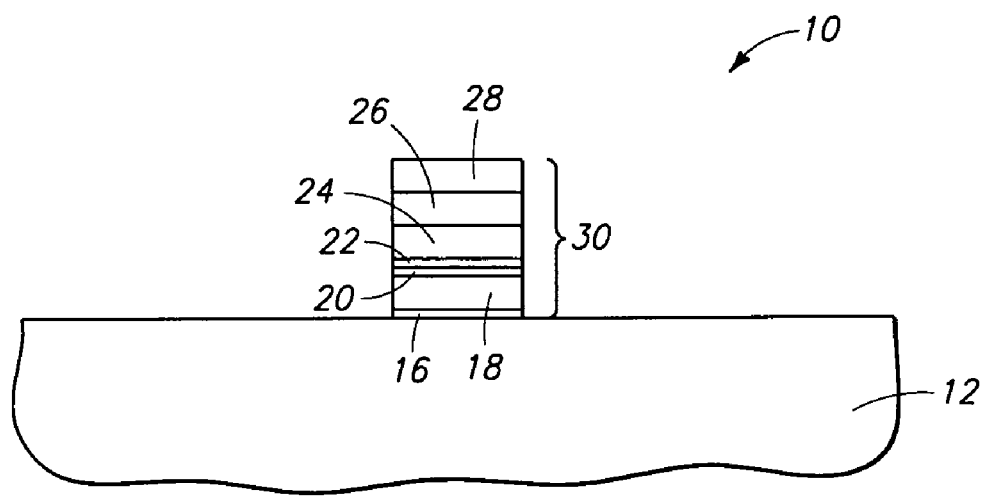
FIG. 3 is a view of the FIG. 1 wafer fragment at a prior art processing step subsequent to that of FIG. 2.

An embodiment encompassed by the present invention is described with reference to FIGS. 4-6. In describing the embodiment of FIGS. 4-6, similar numbering to that utilized above in describing the prior art processing of FIGS. 1-3 will be used, with differences indicated by the suffix "a", or by different numerals.

Figure 4:
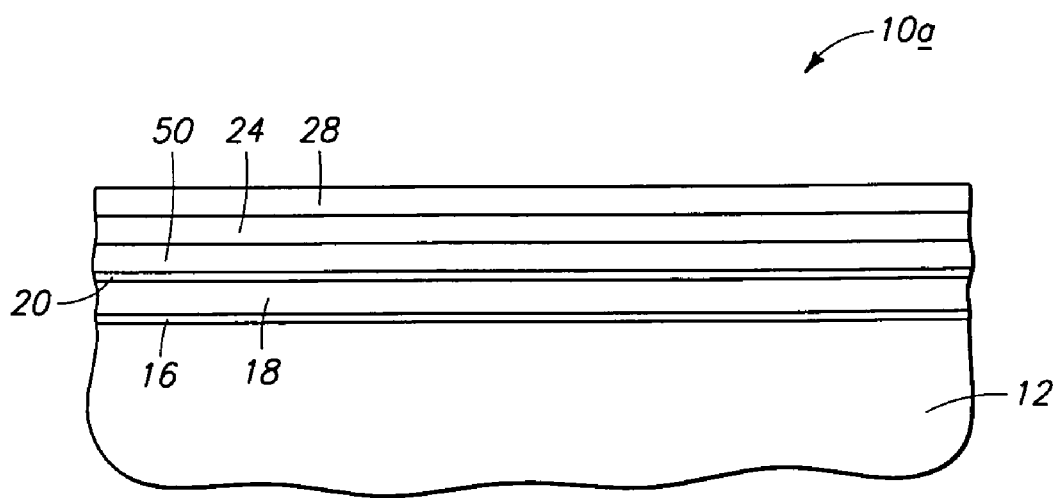
FIG. 4 is a fragmentary, diagrammatic, cross-sectional view of a semiconductive wafer fragment at a preliminary processing step of a method of the present invention.

Referring to FIG. 4, a semiconductive wafer fragment 10a is illustrated at a preliminary processing step. Wafer fragment 10a, like the wafer fragment 10 of FIGS. 1-3, comprises a substrate 12, a gate oxide layer 16, a polysilicon layer 18, and a silicide layer 20. However, in contrast to the prior art processing described above with reference to FIGS. 1-3, a layer 50 comprising silicon, nitrogen, and oxygen is formed over silicide 20, and in the shown preferred embodiment is formed in physical contact with silicide layer 20. Layer 50 thus replaces the oxide layer 22 of the prior art embodiment of FIGS. 1-3.

Layer 50 is preferably formed by chemical vapor deposition (CVD). Layer 50 can be formed by, for example, CVD utilizing $SiH_4$ and $N_2O$ as precursors, in a reaction chamber at a temperature of about 400° C. Such deposition can be performed either with or without a plasma being present within the reaction chamber. Exemplary conditions for depositing layer 50 include flowing $SiH_4$ into a plasma-enhanced CVD chamber at a rate of from about 40 standard cubic centimeters per minute (SCCM) to about 300 SCCM (preferably about 80 SCCM), $N_2O$ at a rate of from about 80 SCCM to about 600 SCCM (preferably about 80 SCCM), He at a rate from about 1300 SCCM to about 2500 SCCM (preferably about 2200 SCCM), with a pressure within the chamber of from about 4 Torr to about 6.5 Torr, and a power to the chamber of from about 50 watts to about 200 watts (preferably about 100 watts).

The above-described exemplary conditions can further include flowing nitrogen gas ($N_2$) into the reaction chamber at a rate of from greater than 0 SCCM to about 300 SCCM, and preferably at a rate of about 200 SCCM, and/or flowing $NH_3$ into the reaction chamber at a rate of from greater than 0 SCCM to about 100 SCCM.

An exemplary composition of layer 50 is $Si_xN_yO_z$:H, wherein x=0.5, y=0.37, and z=0.13. The relative values of x, y, z and the hydrogen content can be adjusted to alter absorbance characteristics of the deposited material. Layer 50 preferably has a thickness of from about 250 Å to about 650 Å.

Layer 50 is preferably provided over silicide layer 20 before annealing layer 20. Layer 50 thus provides the above-described function of oxide layer 22 (described with reference to FIGS. 1-3) of protecting silicide layer 20 from exposure to gaseous oxygen during annealing of the silicide layer.

A silicon nitride layer 24 is formed over layer 50, and can be in physical contact with layer 50. As discussed above in the background section of this disclosure, silicon nitride layer 24 can exert stress on underlying layers. Accordingly, layer 50 can serve a function of prior art silicon dioxide layer 22 (discussed with reference to FIGS. 1-3) of alleviating such stress from adversely impacting underlying conductive layers 20 and 18. Silicon nitride layer 24 can be formed over layer 50 either before or after annealing silicide layer 20.

A photoresist layer 28 is formed over silicon nitride layer 24. In contrast to the prior art embodiment discussed with reference to FIGS. 1-3, there is no antireflective material layer formed between silicon nitride layer 24 and photoresist layer 28. Instead, layer 50 is preferably utilized to serve the function of an antireflective material. Specifically, nitride layer 24 is effectively transparent to radiation utilized in patterning photoresist layer 28. Accordingly, radiation which penetrates photoresist layer 28 will generally also penetrate silicon nitride layer 24 and thereafter enter layer 50. Preferably, the stoichiometry of silicon, oxygen and nitrogen of layer 50 is appropriately adjusted to cancel radiation reaching layer 50 from being reflected back into photoresist layer 28. Such adjustment of stoichiometry can be adjusted with routine experimentation utilizing methods known to persons of ordinary skill in the art. Another way of describing the adjustment of layers 24 and 50 is that layers 24 and 50 can be tuned in thickness (by adjusting thickness of one or both of layers 24 and 50) and stoichiometry (by adjusting a stoichiometry of layer 50) such that reflection back into an overlying layer of photoresist is minimized.

Figure 5:
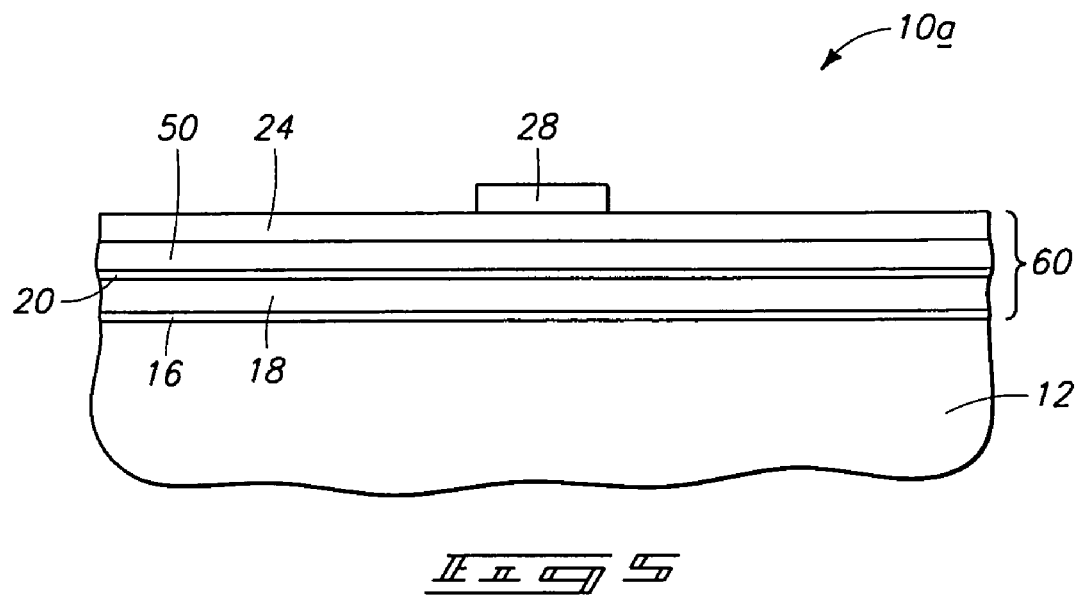
FIG. 5 is a view of the FIG. 4 wafer fragment at a processing step subsequent to that of FIG. 4.

Referring to FIG. 5, photoresist layer 28 is patterned to form a patterned mask over a stack 60 comprising layers 16, 18, 20, 50 and 24.

Figure 6:
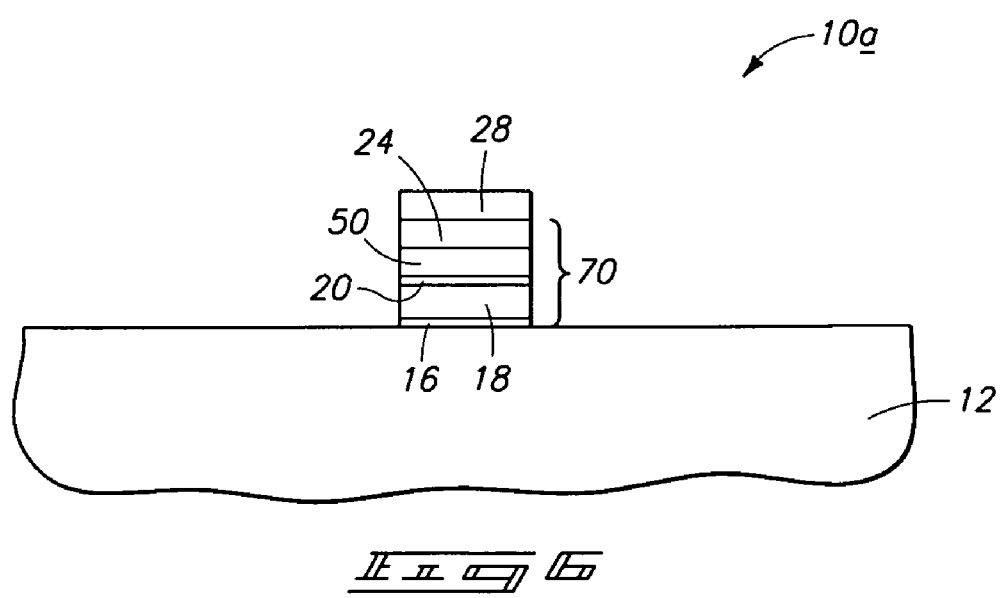
FIG. 6 is a view of the FIG. 4 wafer fragment at a processing step subsequent to that of FIG. 5.

Referring to FIG. 6, a pattern from photoresist layer 28 is transferred to stack 60 (FIG. 5) to form a patterned gate stack 70 comprising layers 16, 18, 20, 50 and 24. Such transfer of a pattern from layer 28 can be accomplished by, for example, a plasma etch utilizing one or more of Cl, HBr, $CF_4$, $CH_2F_2$, He and $NF_3$. Photoresist layer 28 can then be removed from over gate stack 70. Subsequently, source and drain regions can be implanted adjacent the gate stack, and sidewall spacers can be provided over sidewalls of the gate stack to complete construction of a transistor gate from gate stack 70.

The method of the present invention can reduce complexity relative to the prior art gate stack forming method described above with reference to FIGS. 1-3. Specifically, the method of the present invention can utilize a single layer (50) to accomplish the various functions of protecting silicide during annealing, reducing stress from an overlying silicon nitride layer, and alleviating reflections of light during photolithographic processing of an overlying photoresist layer. Accordingly, the method of the present invention can eliminate an entire layer (antireflective layer 26 of FIGS. 1-3) relative to the prior art process described with reference to FIGS. 1-3. Such elimination of a layer also eliminates fabrication steps associated with forming and removing the layer. Accordingly, methods encompassed by the present invention can be more efficient semiconductor fabrication processes then prior art methods.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A gate stack, comprising:
    a gate oxide layer over a semiconductive substrate;
    a polysilicon layer on the gate oxide layer;
    an annealed metal silicide layer on the polysilicon layer;
    a layer comprising $Si_xN_yO_z$:H formed over and in physical contact with the metal silicide layer, wherein x is from 0.39 to 0.65, y is from 0.02 to 0.56, and z is from 0.05 to 0.33; the annealed metal silicide layer being the product of a process in which the metal silicide layer is subjected to an anneal treatment after the layer comprising $Si_xN_yO_z$:H is formed, wherein the layer comprising $Si_xN_yO_z$:H protects the annealed metal silicide layer during the anneal by eliminating exposure to gaseous oxygen during the anneal, further wherein a thickness of the layer comprising $Si_xN_yO_z$:H ranges between a value that is greater than about 300 Angstroms (Å) to a value of approximately 650 Å; and
    a silicon nitride layer on the layer comprising $Si_xN_yO_z$:H and having a thickness greater than 1000 Å, wherein the polysilicon layer, the gate oxide layer, the metal silicide layer, the layer comprising $Si_xN_yO_z$:H, and the silicon nitride layer are patterned to form the gate stack, further wherein the layer comprising $Si_xN_yO_z$:H is configured to reduce a stress on the gate stack that is imposed by the silicon nitride layer and wherein the final thicknesses of both the silicon nitride layer and the layer comprising $Si_xN_yO_z$:H are optimized in combination to minimize reflection back into a overlying layer of photoresist.

2. The gate stack of claim 1 wherein y is from 0.02 to less than 0.1.

3. The gate stack of claim 1 wherein x=0.5, y=0.37 and z=0.13.

4. The gate stack of claim 1 wherein the metal silicide layer comprises titanium.

5. A gate stack, comprising:
    a gate oxide layer over a semiconductive substrate;
    a polysilicon layer on the gate oxide layer;
    an annealed, metal silicide layer on the polysilicon layer;
    a means for protecting the metal silicide layer during an anneal, the means for protecting consisting of a $Si_xN_yO_z$:H layer formed over and in physical contact with the annealed, metal silicide layer, wherein x is from 0.39 to 0.65, y is from 0.02 to 0.56, and z is from 0.05 to 0.33, the means for protecting the metal silicide layer being adapted to act as an antireflective layer, wherein the $Si_xN_yO_z$:H layer reduces a stress on the gate stack; and
    a silicon nitride layer on the $Si_xN_yO_z$:H layer having a thickness greater than 1000 Å, and wherein the final thicknesses of both the silicon nitride layer and the layer comprising $Si_xN_yO_z$:H are optimized in combination to minimize reflection back into a overlying layer of photoresist.

6. The gate stack of claim 5, wherein x=0.5, y=0.37 and z=0.13.

7. The gate stack of claim 5, wherein the metal silicide layer comprises titanium.

8. The gate stack of claim 5, wherein the $Si_xN_yO_z$:H layer has a thickness that ranges from a value greater than approximately 300 Å to a value of approximately 650 Å.

9. The gate stack of claim 5, wherein the means for protecting the annealed metal silicide layer is adapted to protect the metal silicide layer from gaseous oxygen during the anneal.

10. The gate stack of claim 9, wherein the means for protecting the annealed metal silicide layer is adapted to alleviate stress exerted by the silicon nitride layer on layers underlying the layer comprising $Si_xN_yO_z$:H layer.

11. A gate stack, comprising:
    a gate oxide layer over a semiconductive substrate;
    a polysilicon layer on the gate oxide layer;
    an annealed, titanium silicide layer on the polysilicon layer;
    a means for alleviating stress on underlying layers, canceling reflected radiation, and protecting the annealed, titanium silicide layer during an anneal from gaseous oxygen, the means comprising a $Si_xN_yO_z$:H layer formed over and in physical contact with the annealed, titanium silicide layer, wherein x is from 0.39 to 0.65, y is from 0.02 to 0.56, and z is from 0.05 to 0.33; and
    a silicon nitride layer on the $Si_xN_yO_z$:H layer having a thickness greater than 1000 Å, and wherein the final thicknesses of both the silicon nitride layer and the layer comprising $Si_xN_yO_z$:H are optimized in combination to minimize reflection back into a overlying layer of photoresist.

12. The gate stack of claim 11, wherein x=0.5, y=0.37 and z=0.13.

13. The gate stack of claim 11, wherein the $Si_xN_yO_z$:H layer has a thickness that ranges from a value greater than approximately 300 Å to a value of approximately 650 Å.

* * * * *